United States Patent [19]

Christou et al.

[11] 4,316,201

[45] Feb. 16, 1982

[54] LOW-BARRIER-HEIGHT EPITAXIAL GE-GAAS MIXER DIODE

[75] Inventors: Aristos Christou, Springfield; John E. Davey, Alexandria, both of Va.

[73] Assignee: The United States of America as represented by the Secretary of the Navy, Washington, D.C.

[21] Appl. No.: 147,992

[22] Filed: May 8, 1980

[51] Int. Cl.$^3$ .................................... H01L 29/48
[52] U.S. Cl. .................................... 357/15; 357/16
[58] Field of Search .................... 357/15, 16, 12, 6, 57

[56] References Cited

U.S. PATENT DOCUMENTS

| | | | |
|---|---|---|---|
| 4,179,533 | 12/1979 | Christou | 357/15 X |
| 4,197,551 | 3/1980 | Adlerstein | 357/15 |
| 4,201,999 | 5/1980 | Howard | 357/15 |
| 4,226,649 | 10/1980 | Davey | 357/15 X |

*Primary Examiner*—Martin H. Edlow

*Attorney, Agent, or Firm*—Robert F. Beers; William T. Ellis; Vincent J. Ranucci

[57] ABSTRACT

A high-frequency (9.3 GH$_z$–94 GH$_z$) gallium arsenide (GaAs) mixer diode having a low Schottky barrier height (approximately 0.4 eV) for operating at low noise figure levels at low local oscillator power levels (0.25 mW –0.75 mW), includes a GaAs substrate, a thin (about 100 Å) epitaxial layer of germanium on the substrate, the epitaxial germanium being deposited at a rate of about 6 Å per minute and at a substrate temperature in the range of 325° C.–425° C., a layer of silicon dioxide (SiO$_2$), the SiO$_2$ being etched, and layers of platinum-titanium-molybdenum-gold on the growth of epitaxial germanium. Contact areas are then plated with a layer of gold. Ohmic contact to the GaAs substrate side includes a deposition of gold-germanium alloy. Each of the layers are individually deposited at certain temperatures and thicknesses in a vacuum.

14 Claims, 2 Drawing Figures

△ STANDARD Pt-Ti-Mo-Au SCHOTTKY
□ EPITAXIAL Ge-GaAs/Pt-Ti-Mo-Au SCHOTTKY

LOW-BARRIER-HEIGHT EPITAXIAL GE-GAAS MIXER DIODE

BACKGROUND OF THE INVENTION

This invention relates generally to GaAs mixer diodes and more particularly to a high-frequency, low-barrier-height GaAs mixer diode which can operate at low noise figure levels at low local oscillator power levels (0.25 mW- 0.75 mW).

The Schottky-barrier diode is a rectifying metal-semiconductor junction formed by plating, evaporating, or sputtering a variety of metals on n-type or p-type semiconductor materials. Generally n-type silicon and n-type GaAs are used. Due to higher cutoff frequency, GaAs devices are preferred in applications above X-band frequencies. This results from the higher mobility of electrons in GaAs than in silicon. Although in practice this advantage is not as significant as predicted, conversion loss improvement of 0.5 dB at K, band is readily obtainable with GaAs over silicon.

A mixer diode is a device that produces the conversion of a low power level signal from one frequency to another by combining it with a higher power (local-oscillator) signal in a nonlinear device. In general, mixing produces a large number of sum and difference frequencies. Usually the difference frequency between signal and local oscillator-the intermediate frequency (IF)-is of interest and is at a low power level.

Although GaAs Schottky barrier mixer diodes have demonstrated a low noise figure, the barrier heights of such diodes have been substantially higher than those of most silicon Schottky diodes. Due to the pinning of the Fermi level in metal-GaAs systems, the barrier height is vertually independent of the metal and has a typical value of 0.75-0.80 eV. Since the barrier heights of GaAs mixer diodes require high oscillator power. This has prevented the utilization of GaAs mixer diodes in microwave systems which have low, limited local oscillator power.

Initial attempts for developing low barrier height GaAs mixer diodes utilized AuGe alloy as the barrier metal on n-type epitaxial GaAs. These diodes were fabricated for IN78 point contact packages to operate at Ku-band frequencies. This approach, however, is not practical due to failure upon thermal-compression bonding.

Alternatively, low-barrier Schottky diodes have been developed by implanting germanium into epitaxial GaAs. However, these diodes required encapsulation and high temperature annealing to eliminate ion-implantation damage.

SUMMARY OF THE INVENTION

It is the general purpose and object of the present invention to construct a high-frequency (about 9.3 GH$_z$-94 GH$_z$) GaAs mixer diode which has a low Schottky barrier height (about 0.4 eV) and can operate at low noise figure levels at low local oscillator power levels (about 0.25 mW-0.75 mW). This and other objects of the present invention are accomplished by depositing a very thin (approximately 100 Å-150 Å) heterojunction epitaxial layer of germanium on a n/n+ GaAs substrate at a rate of about 6 Å per minute and at a substrate temperature in the range of approximately 325° C.-425° C. Layers of platinum-titanium-molybdenum-gold are deposited on the epitaxial germanium. The thin epitaxial germanium layer on the GaAs substrate is the novel feature of the present invention. It controls the field at the surface of the GaAs, and thus reduces the effective barrier height on n-GaAs. Controlling the field at the surface of the GaAs substrate allows high-temperature metallizations, such as platinum-titanium-molybdenum-gold to be used on GaAs and reduces the effective barrier height of metal GaAs to less than 0.4 eV. The low barrier height provides the advantage of a low noise figure at high frequencies and at low local oscillator power levels. The present invention does not fail under thermal-compression bonding. Since ion-implantation is not involved, the present invention requires no encapsulation and high-temperature annealing.

Other advantages of the invention will become apparent from the following detailed description of the invention when considered in conjunction with the accompanying drawing wherein:

DESCRIPTION OF THE INVENTION

Figure 1:
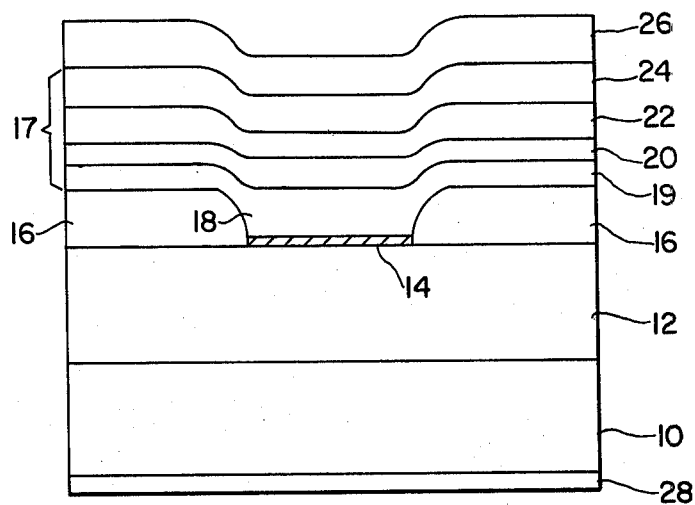
FIG. 1 is a sectional view of the present invention.

Referring now to the drawing, FIG. 1 shows a GaAs substrate 10 prepared in any suitable manner, such as with n+ material doped with approximately $1 \times 10^{18}$ tellurium atoms per cubic centimeter with (100) orientation. A GaAs epitaxial layer 12 about 2.7 microns thick and including an n-type dopant of about $1.1 \times 10^{17}$ atoms per cubic centimeter is typically grown on the substrate 10, such as by the conventional arsenic chloride (As Cl$_3$) process.

The structure comprising layers 10 and 12 is successively cleaned in trichloroethylene for thirty seconds, in acetone for thirty seconds, and in deionized water for thirty seconds. The structure is then etched in diluted hydrofluoric acid (HF), having ten parts water to one part HF, for ten seconds, cleaned in deionized water for thirty seconds, re-etched in a HF-hydrochloric acid (HCl)-hydrogen peroxide (H$_2$O$_2$) solution for two minutes, and finally cleaned in deionized water for thirty seconds. Subsequently, the treated structure is placed in an ion-pumped vacuum system and heated to approximately 575° C. for about fifteen minutes at a pressure of approximately $2 \times 10^{-7}$ Torr to desorb surface oxides. After the desorption of surface oxides, the temperature of the structure is lowered to approximately 325° C.-425° C. and a heterojunction epitaxial layer of germanium 14 is deposited on the structure to a thickness of about 100 Å-150 Å by electron beam evaporation at a rate of approximately 6 Å per minute. The substrate temperature range of about 325° C.-425° C. results in a barrier height in the range of about 0.55 eV-0.40 eV respectively.

The substrate temperature must be sufficient to develop an epitaxial growth for completely covering and uniformly wetting the substrate. The thickness of the epitaxial layer of germanium must be sufficient for tunneling electrons from the metal overlayers to the GaAs and for producing an effective lowering of the barrier height. The rate of deposition of the epitaxial germanium on the GaAs substrate must be sufficient for epitaxial growth.

Following the deposition of germanium, a layer of silicon dioxide (SiO$_2$) 16 is typically deposited on the germanium epitaxial layer 14, as for example, by reacting silane and oxygen at about 425° C. until a thickness of approximately 8000 Å is achieved. A window 18 about 7.5 microns in diameter is suitably etched in the SiO$_2$ by using a photoresist mask and a buffered hydrofluoric acid etch. A retractory metal structure 17 having a high temperature handling capability is deposited on the germanium. For example, platinum 19, titanium 20, molybdenum 22 and gold 24 refractory layers of about 1500 Å, 1000 Å, 2000 Å and 2000 Å thicknesses, respectively, are sputtered sequentially on the structure at a substrate temperature of typically about 100° C.–125° C. Using a photoresist process, a second mask defines an area of approximately 12 microns in diameter which is centered on the structure. Excess platinum, titanium, molybdenum and gold is etched. A conducting layer of gold 6, about 5000 Å thick, is deposited on the refractory layers of the structure at a substrate temperature of typically about 100° C. An ohmic contact 28 to the n+ layer of GaAs is suitably obtained, such as by evaporating a gold-germanium alloy (approximately 88% gold and 12% germanium) about 3000 Å thick at a substrate temperature of approximately 200° C. on the n+ GaAs.

Growth conditions for depositing the epitaxial germanium layer are for forming a p-type heterojunction between the germanium which is doped at $1 \times 10^{18}$, and the GaAs. Such a heterojunction produces effective tunneling of electrons and image force lowering of the Schottky barrier.

Figure 2:
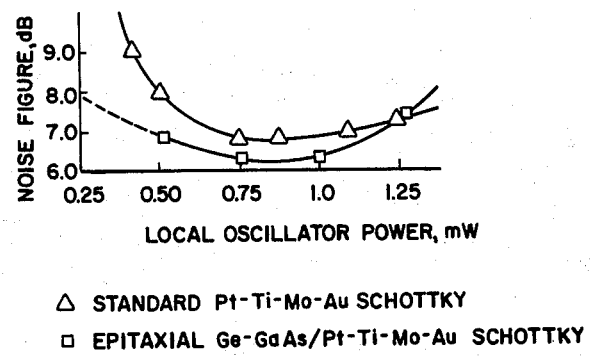
FIG. 2 is a graph illustrating the variation of noise figure with local oscillator power level for the present invention and standard diodes.

FIG. 2 illustrates the variation of noise figure with local oscillator power for the present invention in comparsion to the noise figure for previously available diodes. The epitaxial germanium-GaAs diodes exhibit a noise figure of 6.3 dB at 0.75 mW. The standard diodes show very high noise-figure values at the 0.5 mW power level. In contrast, the epitaxial germanium-GaAs diodes exhibit a noise figure of less than 7.0 dB at 0.50 mW local oscillator power.

Obviously many more modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. In a gallium arsenide (GaAs) mixer diode having a low Schottky-barrier height in the range of approximately 0.40 eV–0.55 eV for operating at high frequencies (X-band and above) at low local oscillator power levels (about 0.25 mW–0.75 mW), the mixer diode having a GaAs substrate, a GaAs epitaxial layer on the GaAs substrate, a refractory metal overlayer structure, a conducting layer of metal on the overlayer structure, and an ohmic contact to the GaAs substrate, the improvement comprising:
a thin heterojunction epitaxial layer of germanium on the GaAs epitaxial layer, said refractory metal overlayer structure being on the epitaxial layer of germanium, the thickness of the epitaxial layer of germanium being sufficient for tunneling of electrons from the metal overlayer to the GaAs and for producing an effective lowering of the Schottky barrier height, the GaAs being maintained at a temperature, during deposition of the epitaxial germanium on the GaAs, sufficient to develop an epitaxial growth for completely covering and uniformly wetting the GaAs, and the epitaxial germanium being deposited on the GaAs at a rate sufficient for epitaxial growth.

2. The improvement as recited in claim 1, wherein the thickness of said epitaxial layer of germanium is in the range of approximately 100 Å–150 Å.

3. The improvement as recited in claim 1, wherein the temperature at which said GaAs is maintained during deposition of the epitaxial germanium is in the range of about 325° C.–425° C.

4. The improvement as recited in claim 1, wherein the rate at which said epitaxial germanium is deposited on the GaAs is about 6 Å per minute.

5. A gallium arsenide (GaAs) mixer diode having a low Schottky barrier height in the range of approximately 0.40 eV–0.55 eV for operating at high frequencies (X-band and above) at low local oscillator power levels (about 0.25 mW–0.75 mW), comprising:
a GaAs substrate;
a GaAs epitaxial layer on the GaAs substrate;
a thin heterojunction epitaxial layer of germanium on the GaAs epitaxial layer, the GaAs being maintained at a temperature, during deposition of the epitaxial germanium on the GaAs, sufficient to develop an epitaxial growth for completely covering and uniformly wetting the GaAs, and the epitaxial germanium being deposited on the GaAs at a rate sufficient for epitaxial growth;
a refractory metal overlayer structure on the epitaxial layer of germanium, said refractory structure having a high temperature handling capability, and the thickness of said epitaxial layer of germanium being sufficient for tunneling of electrons from said refractory metal overlayer to the GaAs and for producing an effective lowering of the Schottky barrier height;
a conducting layer of metal on the refractory structure; and
an ohmic contact to the GaAs substrate.

6. The GaAs mixer diode as recited in claim 5, wherein the thickness of said epitaxial layer of germanium is in the range of approximately 100 Å–150 Å.

7. The GaAs mixer diode as recited in claim 5, wherein the temperature at which said GaAs is maintained during deposition of the epitaxial germanium is in the range of about 325° C.–425° C.

8. The GaAs mixer diode as recited in claim 1, wherein the rate at which said epitaxial germanium is deposited on the GaAs is about 6 Å per minute.

9. The GaAs mixer diode as recited in claim 1, wherein said refractory metal overlayer structure includes platinum-titanium-molybdenum-gold.

10. The GaAs mixer diode as recited in claim 1, wherein said conducting layer of metal is gold.

11. The GaAs mixer diode as recited in claim 1, wherein said ohmic contact is a gold-germanium alloy (approximately 88% gold - 12% germanium).

12. The GaAs mixer diode as recited in claim 9, wherein said platinum-titanium-molybdenum-gold have thicknesses of about 1500 Å, 1000 Å, 2000 Å and 2000 Å, respectively, and are deposited at a GaAs substrate temperature of approximately 100° C.–125° C.

13. The GaAs mixer diode as recited in claim 10, wherein said layer of gold is about 5000 Å in thickness and is deposited at a GaAs substrate temperature of about 100° C.

14. The GaAs mixer diode as recited in claim 11, wherein said gold-germanium alloy is approximately 3000 Å thick and is deposited at a GaAs substrate temperature of about 200° C.

* * * * *